United States Patent [19]
Liou et al.

[11] Patent Number: 6,017,790
[45] Date of Patent: Jan. 25, 2000

[54] METHOD OF MANUFACTURING EMBEDDED DYNAMIC RANDOM ACCESS MEMORY

[75] Inventors: Fu-Tai Liou, Hsinchu; Water Lur, Taipei, both of Taiwan

[73] Assignee: United Microelectronics Corp., Hsinchu, Taiwan

[21] Appl. No.: 09/173,706

[22] Filed: Oct. 15, 1998

[30] Foreign Application Priority Data

Jul. 6, 1998 [TW] Taiwan ................................. 87110879

[51] Int. Cl.⁷ ............................................. H01L 21/8242
[52] U.S. Cl. ........................................... 438/240; 438/241
[58] Field of Search ................................... 438/210, 240, 438/241, 253, 396

[56] References Cited

U.S. PATENT DOCUMENTS

| | | | |
|---|---|---|---|
| 4,039,698 | 8/1977 | Fraser et al. ............................. | 427/34 |
| 4,471,004 | 9/1984 | Kim .......................................... | 427/88 |
| 5,292,677 | 3/1994 | Dennison ................................. | 438/396 |
| 5,296,399 | 3/1994 | Park .......................................... | 437/52 |
| 5,399,890 | 3/1995 | Okada et al. ............................ | 257/306 |
| 5,644,151 | 7/1997 | Izumi et al. ............................. | 257/306 |
| 5,716,875 | 2/1998 | Jones, Jr. et al. ....................... | 438/210 |
| 5,773,314 | 6/1998 | Jiang et al. .............................. | 438/240 |
| 5,858,831 | 1/1999 | Sung ........................................ | 438/241 |
| 5,930,618 | 7/1999 | Sun et al. ................................. | 438/240 |

*Primary Examiner*—Chandra Chaudhari
*Attorney, Agent, or Firm*—Hickman Stephens Coleman & Hughes, LLP

[57] ABSTRACT

A method of manufacturing embedded DRAM capable of integrating memory circuit regions and logic circuit regions together such that their top surfaces are at the same height, and hence able to maintain a high degree of planarity in integrated circuits. The method includes depositing a layer of refractory metal oxide over a high aspect ratio contact hole. Then, through the selective application of a hydrogen plasma treatment or hot hydrogen treatment, a portion of the deposited refractory metal oxide on the contact hole is transformed from non-conductive to conductive material, whereas the refractory metal oxide without a hydrogen plasma treatment or hot hydrogen treatment remains non-conductive. Therefore, a non-conductive refractory metal oxide layer can be used as a dielectric layer for a DRAM capacitor.

30 Claims, 6 Drawing Sheets

METHOD OF MANUFACTURING EMBEDDED DYNAMIC RANDOM ACCESS MEMORY

CROSS-REFERENCE TO RELATED APPLICATION

This application claims the priority benefit of Taiwan application serial no. 87110879, filed Jul. 6, 1998, the full disclosure of which is incorporated herein by reference.

BACKGROUND OF THE INVENTION

1. Field of Invention

The present invention relates to a method of manufacturing dynamic random access memory (DRAM). More particularly, the present invention relates to a method of manufacturing embedded DRAM.

2. Description of Related Art

Embedded DRAM is a type of integrated circuit (IC) that combines DRAM circuits and logic circuits together in a semiconductor substrate. Nowadays, the trend in manufacturing semiconductor ICs is to integrate memory cell arrays with high-speed logic circuit elements. For example, microprocessors or digital signal processors all have integrated circuits that incorporate embedded memory.

At present, semiconductor manufacturers are striving to increase functionality of the devices while maintaining or lowering their production cost. By miniaturizing and fabricating sub-micron semiconductor devices, the goals of increased functionality and reduced production cost are partially met. Sub-micron technology reduces device function degradation and parasitic capacitance, and hence is capable of improving device functionality. Furthermore, sub-micron technology produces smaller semiconductor chips. Since a small size chip function similar to a large chip, more silicon chips can be fabricated on a given size silicon wafer. Hence, the average production cost of each chip is lower.

Another route semiconductor manufacturers are taking is towards the integration of logic circuit elements with memory devices in a semiconductor chip. This has the benefit of decreasing production cost as well as improving the functional capacity of the devices. Integration improves functionality by lowering the time delay for sending signals from a memory device in one part of a semiconductor chip to a logic device in another part of another semiconductor chip. In addition, by putting memory and logic devices together on a semiconductor chip, cost of production is lowered because they can share most common fabrication procedures.

Attempts at providing a method of integrating logic circuits and memories together in a single chip have been made by various semiconductor manufacturers. For example, Dennison et al. in U.S. Pat. No. 5,292,677 has proposed a method of fabricating complementary metal oxide semiconductor (CMOS) devices and dynamic random access memory (DRAM) devices on a single semiconductor chip. However, in fabricating these two elements, the method does not share many fabrication steps, and hence is unable to significantly affect the production cost. Moreover, the method does not include the fabrication of high-efficiency logic devices.

To fabricate high-efficiency high-speed logic circuits and memory circuits together on a single semiconductor chip, a number of manufacturing aspects must be considered. Most often, consideration is directed towards either the processing of the logic circuit or the memory circuit, and both aspects are rarely considered together.

In light of the foregoing, there is a need to provide an improved method of integrating logic and memory circuits together on a single silicon chip.

SUMMARY OF THE INVENTION

Accordingly, the present invention is to provide a method of manufacturing embedded memory capable of increasing the number of shared processing steps with the fabrication of high-efficiency high-speed logic devices so that production cost can be reduced.

In another aspect, the invention provides a method of manufacturing embedded DRAM so that the upper surface of the memory circuit regions and the upper surface of the logic circuit regions are at the same height, and hence the degree of planarity of the integrated circuit is increased.

In yet another aspect, the invention provides an improved method of manufacturing embedded DRAM. The method is to deposit a layer of refractory metal oxide over a high aspect ratio contact hole. Then, hydrogen plasma or hot hydrogen is used to treat the deposited refractory metal oxide so that the refractory metal oxide is transformed from electrically non-conductive to conductive.

In one further aspect, the invention is to provide a method of manufacturing embedded DRAM. The method is to deposit a layer of refractory metal oxide over a high aspect ratio contact hole. Then, hydrogen plasma or hot hydrogen is used to treat a portion of the deposited refractory metal oxide on the contact hole. The portion of the refractory metal oxide treated by the hydrogen plasma or hot hydrogen is transformed from electrically non-conductive to conductive. On the other hand, the portion of the refractory metal oxide not exposed to hydrogen plasma or a hot hydrogen treatment remains non-conductive and can be used as a dielectric layer for a DRAM capacitor.

To achieve these and other advantages and in accordance with the purpose of the invention, as embodied and broadly described herein, the invention provides a method of manufacturing embedded DRAM. The method comprises the steps of first providing a substrate having a memory circuit region and a logic circuit region already defined. Next, a plurality of transfer field effect transistors are formed in the memory circuit region with each transfer field effect transistor having a first and a second source/drain region and a first gate electrode. Additionally, a plurality of logic field effect transistors are formed in the logic circuit region with each logic field effect transistor having a third and a fourth source/drain region and a second gate electrode.

Thereafter, a first insulating layer is formed over the substrate, and then the first insulating layer is patterned to form a plurality of first and second openings in the memory circuit region that exposes the first and second source/drain regions of each transfer field effect transistor. Similarly, a plurality of third openings are formed in the logic circuit region with each third opening exposing at least one conductive region in the logic circuit region.

Subsequently, a first conductive layer is formed over the first insulating layer. The first conductive layer covers the first, the second and the third openings but does not completely fill those openings. Next, a refractory metal oxide layer is formed over the first conductive layer. Thereafter, a mask layer is formed over the refractory metal oxide layer, at least covering the first openings, and at least exposing the regions above the second openings and the third openings. Subsequently, a hydrogen treatment is performed to transform the exposed refractory metal oxide layer into a conductive layer. Then, the mask layer is removed. After that, a second conductive layer is formed over the refractory metal oxide layer. Then, the second conductive layer, the refractory metal oxide layer and the first conductive layer are patterned. Consequently, an upper electrode, a dielectric layer and a lower electrode of a capacitor are formed above each first opening, and a first and a second contact interconnects are formed above each second and third opening, respectively.

According to one preferred embodiment of this invention, the first conductive layer can be patterned before forming the refractory metal oxide layer. In addition, the refractory metal oxide layer can be patterned before performing the hydrogen treatment.

According to another aspect of this invention, the method of manufacturing an embedded DRAM further includes the steps of first forming a second insulating layer above the second conductive layer. Thereafter, a plurality of fourth openings are formed in the second insulating layer, exposing the upper electrode of each capacitor, and a plurality of fifth openings are formed in the second insulating layer, exposing a portion of the second conductive layer electrically connected to at least one other conductive layer. Next, a third conductive layer is formed, filling the fourth and the fifth openings and covering the second insulating layer. Subsequently, the third conductive layer is patterned, forming a plurality of first conductive lines, each connected to a reference voltage through a fourth opening and an upper electrode of the capacitor, as well as a plurality of second conductive lines, each connected to at least one conductive region through a fifth opening.

In another embodiment of this invention, a method of manufacturing embedded DRAM is provided comprising the steps of first providing a substrate having a memory circuit region and a logic circuit region already defined. Next, at least one transfer field effect transistor is formed in the memory circuit region with the transfer field effect transistor having a first and a second source/drain regions and a first gate electrode. In addition, at least one field effect transistor is formed in the logic circuit region with the logic field effect transistor having a third and a fourth source/drain regions and a second gate electrode.

Thereafter, a first insulating layer is formed over the substrate, and then the first insulating layer is patterned to form a first opening and a second opening in the memory circuit region that exposes the first and second source/drain regions of the transfer field effect transistor. Similarly, a third opening is formed in the logic circuit region such that the third opening exposes at least one conductive region in the logic circuit region. Subsequently, a first conductive layer is formed over the first insulating layer. The first conductive layer fills the first, the second and the third openings. Next, a refractory metal oxide layer is deposited over the first conductive layer. Thereafter, a mask layer is formed over the refractory metal oxide layer at least covering the first opening, and at least exposing the regions above the second opening and the third opening.

Subsequently, a hydrogen treatment is performed to transform the exposed refractory metal oxide layer into a conductive layer. Then, the mask layer is removed. After that, a second conductive layer is formed over the refractory metal oxide layer. Then, the second conductive layer, the refractory metal oxide layer and the first conductive layer are patterned. Finally, an upper electrode, a dielectric layer and a lower electrode of a capacitor are formed above the first opening, and a first and a second contact interconnects are formed above the second opening and the third opening respectively.

According to yet another preferred embodiment of this invention, the method of manufacturing an embedded DRAM further includes the steps of first forming a second insulating layer above the second conductive layer. Thereafter, a fourth opening is formed in the second insulating layer exposing the upper electrode of a capacitor, and a fifth opening is formed in the second insulating layer, exposing a portion of the second conductive layer electrically connected to at least one conductive layer. Next, a third conductive layer is formed filling the fourth and the fifth openings and covering the second insulating layer. Subsequently, the third conductive layer is patterned forming a first conductive line connected to a reference voltage through a fourth opening and an upper electrode of the capacitor as well as a second conductive line connected to at least one conductive region through a fifth opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
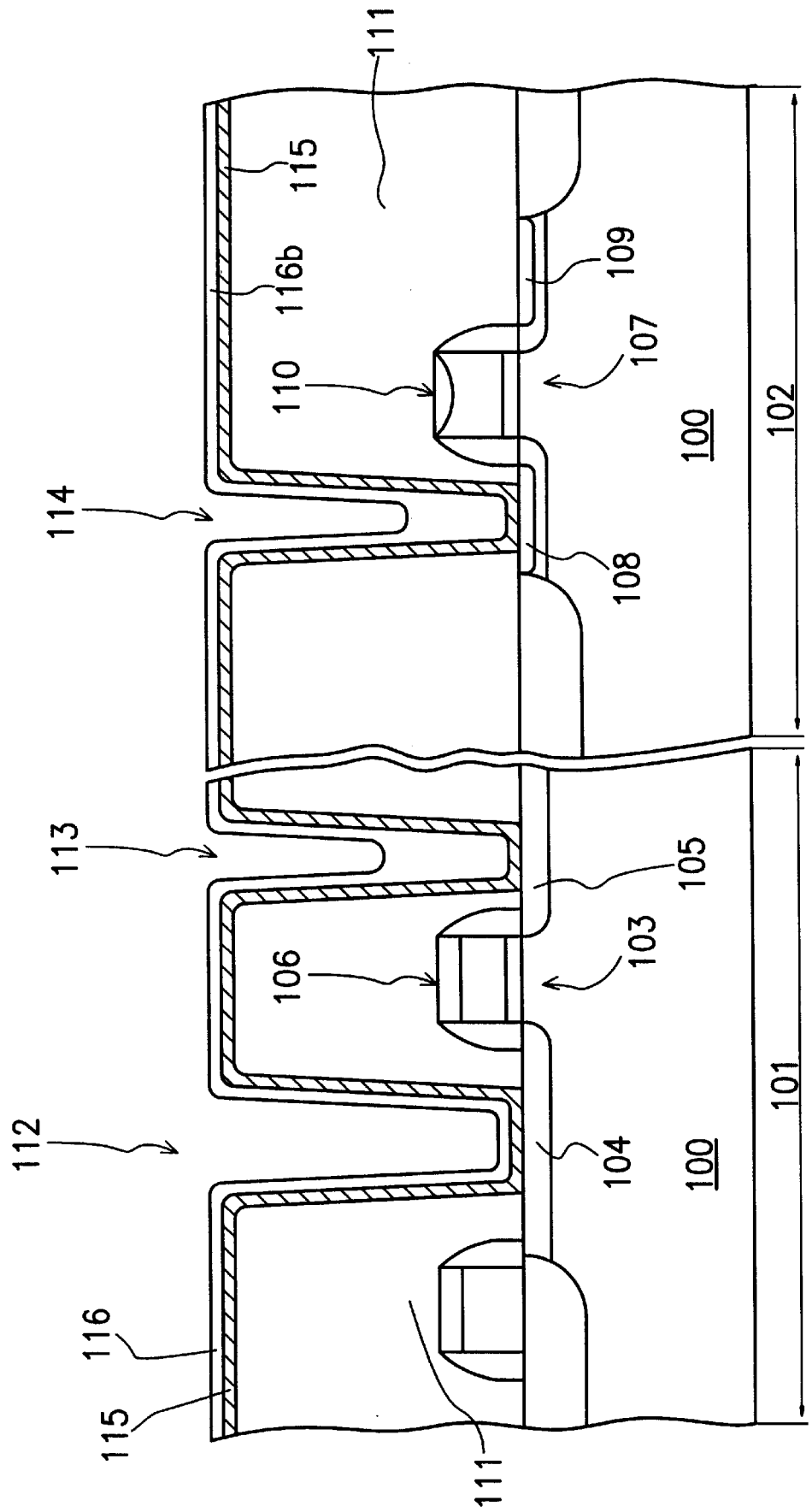
FIGS. 1A through 1F are cross-sectional views showing the progression of manufacturing steps in fabricating embedded DRAM according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Refractory metal oxides such as titanium oxide ($TiO_2$), tantalum pentoxide ($Ta_2O_5$), ferrous oxide ($Fe_2O_3$) and barium titanium oxide ($BaTiO_3$) are wide band-gap insulating materials. If a hydrogen plasma treatment or a hot hydrogen treatment is carried out to insert hydrogen into the spaces between metallic ions or oxygen vacancies of the refractory metal oxide, the oxygen content of the refractory metal oxide decreases. Hence, the refractory metal oxide will be converted into an n-type conductive oxide. In other words, the original refractory metal oxide will be transformed from a material having insulating properties to one having semi-conductive or conductive properties. The reaction mechanism is summarized in the following formula:

$$O^{2-} \rightarrow \tfrac{1}{2}O_2 + 2e^-$$

Since the electrical conductivity of refractory metal oxide after a hydrogen-plasma treatment or a hot-hydrogen treatment depends on its oxygen content, the refractory metal oxide can be made into semi-conductive material or conductive material. Furthermore, the value of the resistance when the refractory metal oxide is converted to a conductive material can be adjusted accordingly.

Methods related to the transformation of refractory metal oxide into conductive material can be found in a number articles. These articles include one written by Fu-Tai Liou (one of the inventors in this invention) published under the title "Semiconductor electrodes for photoelectrolysis" by the State University of New York in 1982 (details shown in page 151). A second article written by C. Y. Yang et al. published under the title "Solid electrochemical modification of semiconductors" in Solid State Communication, Vol. 43, No. 8, pp. 633–636 (details shown in page 633). A third article, also written by Fu-Tai Liou et al., was published under the title "Photoelectrolysis at $Fe_2O_3/TiO_2$ Heterojunction Electrode" in the Journal of the Electrochemical Society, Vol. 129, No. 2, pp. 342–345 (details shown in page 342).

This invention makes use of the techniques suggested in the aforementioned articles to improve the method of forming embedded DRAM. The main characteristic of this invention is the deposition of a layer of refractory metal oxide over a contact hole having a high aspect ratio. Then, the electrical conductivity of the refractory metal layer on the contact hole is converted from non-conductive to conductive using a hydrogen plasma treatment or a hot hydrogen treatment.

FIGS. 1A through 1F are cross-sectional views showing the progression of manufacturing steps taken to fabricate embedded DRAM according to one preferred embodiment of this invention.

First, as shown in FIG. 1A, a semiconductor substrate 100 is provided. The semiconductor substrate 100 can be divided into a memory circuit region 101 and a logic circuit region 102. Furthermore, the memory circuit region 101 has at least one transfer field effect transistor (transfer FET) 103. The transfer FET 103 has a first and a second source/drain regions 104, 105 and a first gate electrode 106. In addition, the logic circuit region 102 has at least one logic field effect transistor (logic FET) 107. The logic FET 107 has a third and a fourth source/drain regions 108, 109 and a second gate electrode 110. Thereafter, a first insulating layer 111 is formed over the substrate 100. Next, the first insulating layer 111 is patterned to form a first opening 112 and a second opening 113 above the memory circuit region 101 and a third opening 114 above the logic circuit region 102. The first opening 112 and the second opening 113 expose the first and the second source/drain regions 104 and 105 of the transfer FET 103, respectively. The third opening 114 exposes at least one conductive region in the logic circuit region 102. The exposed conductive region can be the gate electrode or one of the source/drain regions of the logic FET. For example, the third opening exposes the source/drain region 108 as shown in FIG. 1A. Subsequently, a first conductive layer 115 is formed over the first insulating layer 111. The first conductive layer 115 can be, for example, a metallic titanium layer, a metallic tungsten layer, a titanium nitride layer or a titanium/titanium nitride layer. The first conductive layer 115 covers the surface of the first, the second and the third openings 112, 113 and 114, respectively. Next, a refractory metal oxide layer 116 is formed over the first conductive layer 115. Materials such as titanium oxide ($TiO_2$), tantalum pentoxide ($Ta_2O_5$), ferrous oxide ($Fe_2O_3$) and barium titanium oxide ($BaTiO_3$) can be used to make the refractory metal oxide layer 116. At this stage, the refractory metal oxide layer 116 is still an insulating layer.

The first conductive layer 115 can be patterned before forming the refractory metal oxide layer 116 over the first conductive layer 115. If the first conductive layer 115 is patterned before depositing the refractory metal oxide, subsequent depositions of refractory metal oxide will cover the edge of the first conductive layer 115.

Figure 1B:
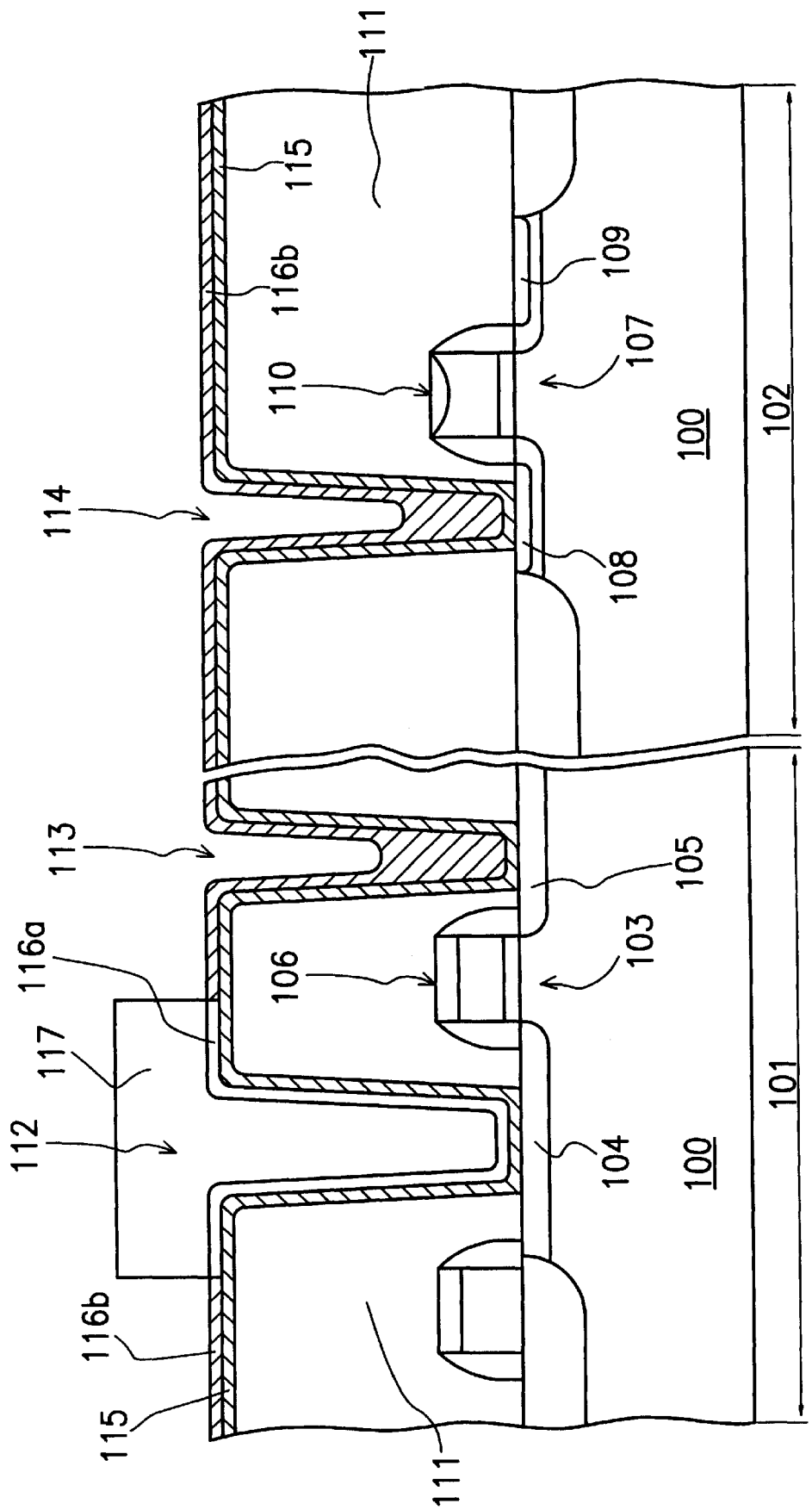
Figure 1C:
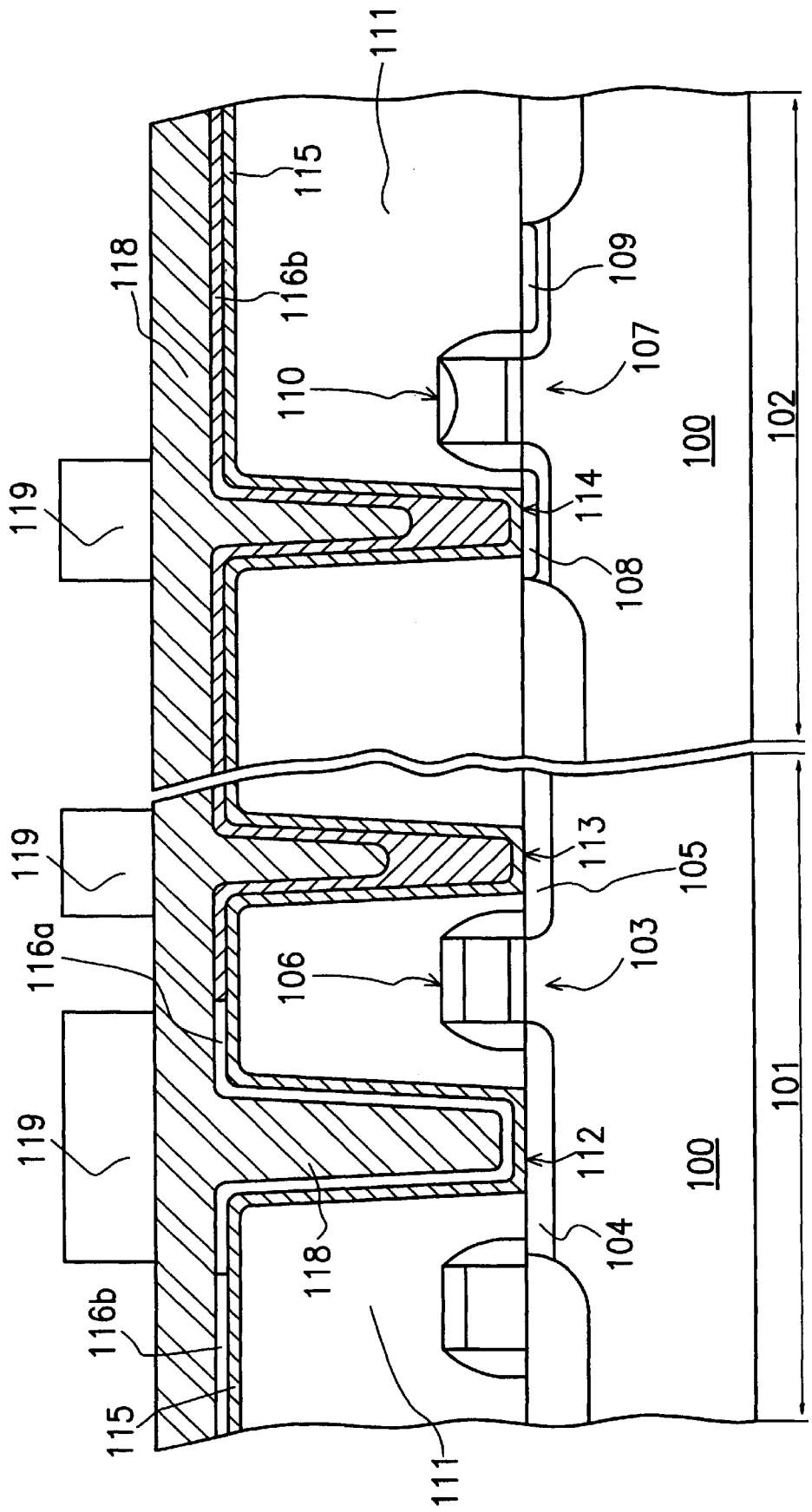

Next, as shown in FIG. 1B, a mask layer 117 is formed over the refractory metal oxide layer 116. The mask layer 117 can be, for example, a photoresist layer or a diffusion barrier layer at least covering the first opening 112 and at least exposing the second opening 113 and the third opening 114. Thereafter a hydrogen treatment, for example, a hydrogen plasma treatment or a hot hydrogen treatment, converts the exposed refractory metal oxide layer 116 into a conductive layer. After the hydrogen treatment the exposed portion of the refractory metal oxide layer 116 is converted into a conductive refractory metal oxide layer 116b, while the unexposed refractory metal oxide layer 116a remains non-conductive. In addition, the refractory metal oxide layer 116 can be patterned before the hydrogen treatment is carried out.

Figure 1D:
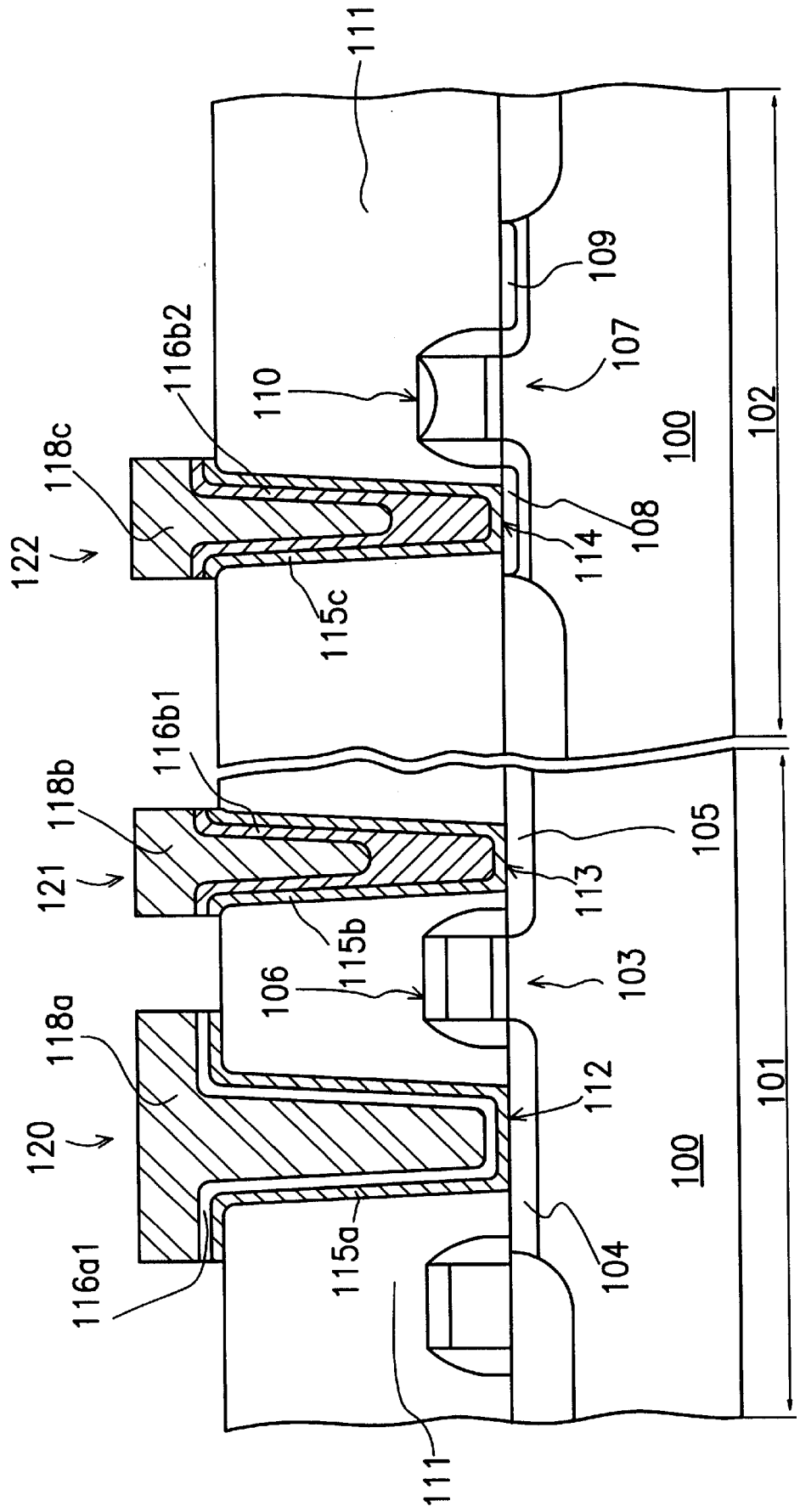
Figure 1E:
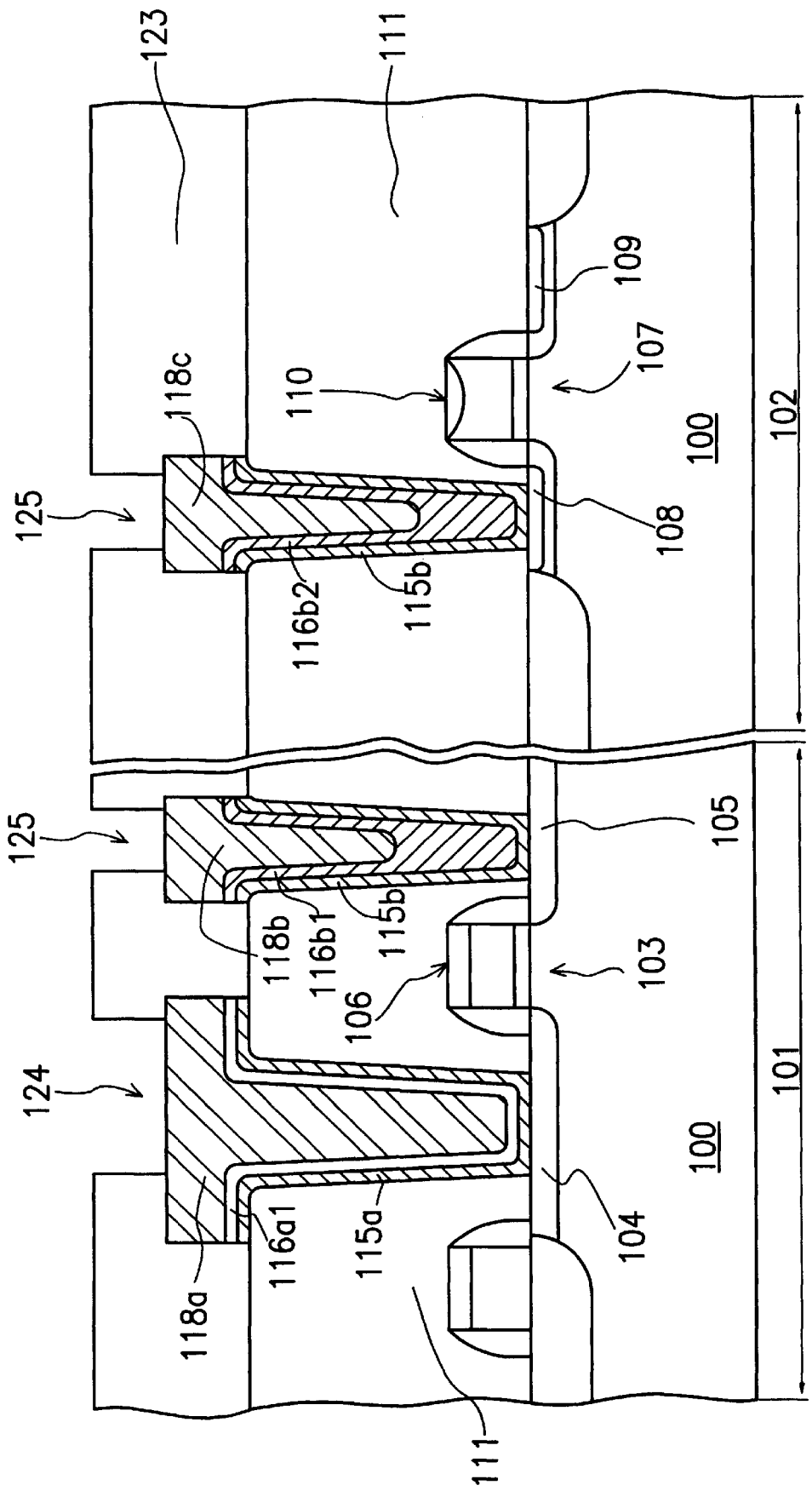

Next, as shown in FIGS. 1D and 1E, the mask layer 117 is removed. Thereafter, a second conductive layer 118, for example, metallic tungsten, is formed over the refractory metal oxide layer 116 (116a and 116b). Then, another mask layer 119 is formed over the second conductive layer 118. The second conductive layer 118, the refractory metal oxide layer 116 and the first conductive layer 115 are patterned using the mask layer 119. Consequently, a conductive layer 118a, a non-conductive layer 116a1 and a conductive layer 115a are formed above the first opening 112. The conductive layer 118a, the non-conductive layer 116a1 and the conductive layer 115a are respectively the upper electrode, the dielectric layer and the lower electrode of a capacitor 120. At the same time, a first contact interconnect 121 and a second contact interconnect 122 are formed above the second opening 113 and the third opening 114, respectively. The first contact interconnect 121 comprises the second conductive layer 118b, the refractory metal oxide layer 116b1, and the first conductive layer 115b. The second contact interconnect 122 comprises the second conductive layer 118c, the refractory metal oxide layer 116b2, and the first conductive layer 115c. Finally, the mask layer 119 is removed.

Subsequently, as shown in FIGS. 1E, a second insulating layer 123 is formed over the second conductive layer 118 (118a, 118b and 118c). Next, a fourth opening 124 is formed in the second insulating layer 123 exposing the upper electrode 118a of the capacitor. In the meantime, a fifth opening 125 is formed in the second insulating layer 123, exposing a portion of the second conductive layer 118, for example, the conductive layer 118b or 118c. The conductive layer 118b or 118c is electrically connected to a conductive region.

Figure 1F:
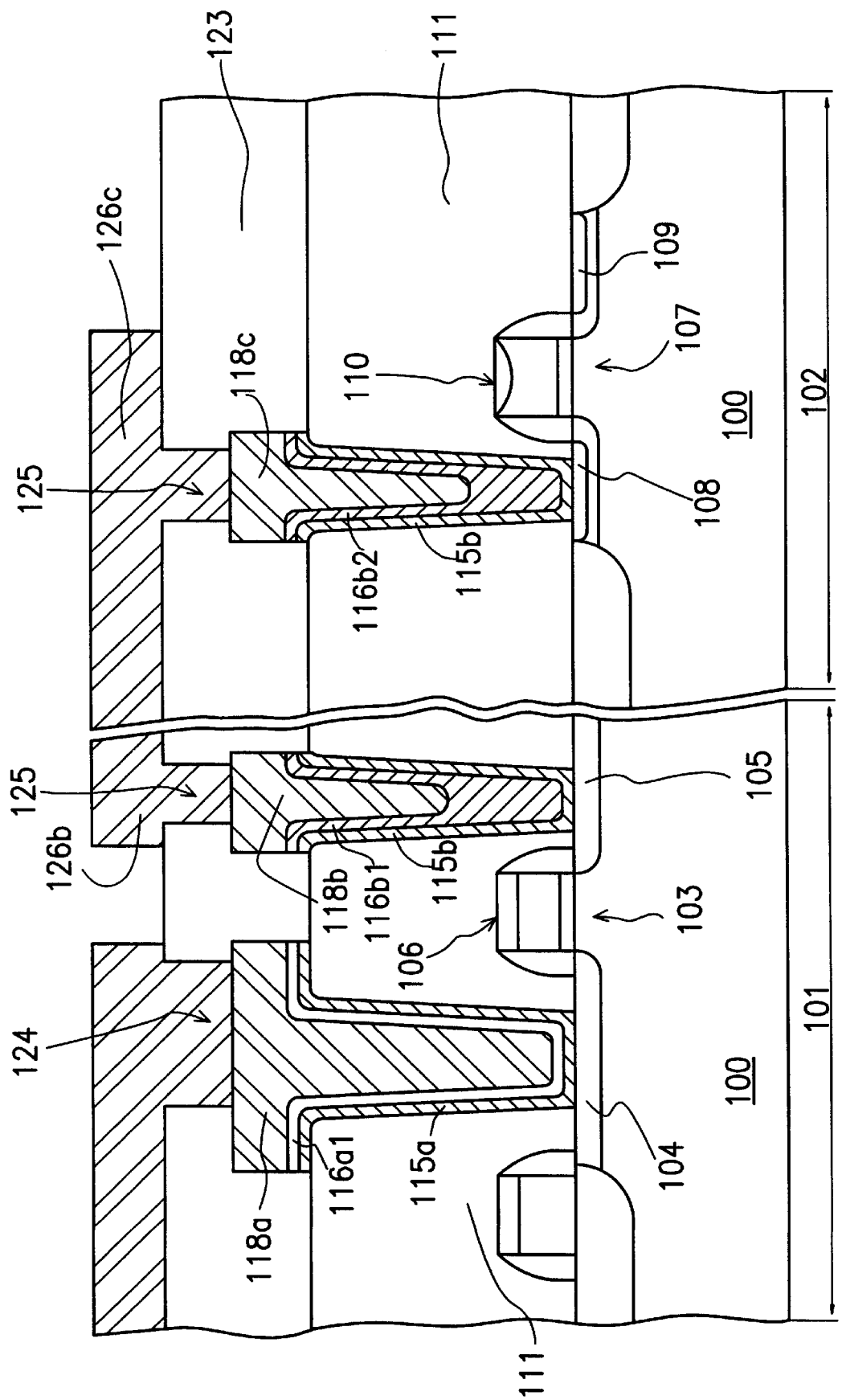

Next, as shown in FIG. 1F, a third conductive layer 126 is formed over the fourth and the fifth openings 124, 125 and the second insulating layer 123. The third conductive layer 126 can be, for example, an aluminum layer, a copper layer or an aluminum-copper alloy. Subsequently, the third conductive layer 126 is patterned to form a first conductive line 126a that supplies a reference voltage, for example, ½ $V_{cc}$, to the upper electrode 118a of the capacitor through the fourth opening 124. Similarly, a second conductive line 126b or 126c is formed each having connection with at least one conductive region through the fifth opening 125.

The upper surface of the upper electrode and the contact interconnects fabricated by the above method are at the same relative height. Hence, the memory circuit region and the logic circuit region are also at about the same relative height. Consequently, the degree of planarity for an integrated circuit is increased considerably.

Furthermore, this invention also provides a method of manufacturing embedded DRAM by depositing a layer of refractory metal oxide over a high aspect ratio contact hole. Then, through a hydrogen plasma or hot hydrogen treatment, a portion of the deposited refractory metal oxide on the contact hole is transformed from non-conductive to conductive material, whereas the portion of refractory metal oxide that is not so treated remains non-conductive. Therefore, the untreated refractory metal oxide layer can be used as a dielectric layer for a DRAM capacitor. In summary, the invention is able to combine memory circuits and logic circuits together, thereby lowering production cost while maintaining good surface planarity for a silicon wafer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an embedded dynamic random access memory DRAM), comprising:

providing a substrate that has a memory circuit region and a logic circuit region, wherein the memory circuit region has a plurality of transfer field effect transistors (transfer FETs) with each transfer FET having a first and a second source/drain region and a first gate electrode, and the logic circuit region has a plurality of logic field effect transistors (logic FETs) with each logic FET having a third and a fourth source/drain region and a second gate electrode;

forming a first insulating layer over the substrate;

patterning the first insulating layer to form a plurality of first and second openings above the memory circuit region and a plurality of third openings above the logic circuit region, wherein each first and second opening exposes the respective first and second source/drain regions of each transfer FET, and each third opening exposes at least one of the conductive regions in the logic circuit region;

forming a first conductive layer above the first insulating layer so that it covers the first, the second and the third openings without completely filling them;

forming a refractory metal oxide layer over the first conductive layer;

forming a mask layer above the refractory metal oxide layer, the mask layer at least covering the first openings and at least exposing the second openings and the third openings;

performing a hydrogen treatment so that the exposed refractory metal oxide layer is converted to an electrically conductive layer;

removing the mask layer;

forming a second conductive layer above the refractory metal oxide layer; and patterning the second conductive layer, the refractory metal oxide layer and the first conductive layer to form respectively an upper electrode, a dielectric layer and a lower electrode of a capacitor above each first opening, and forming a first and a second contact interconnect above each second and third opening.

2. The method of claim 1, wherein the step of forming the refractory metal oxide layer includes depositing one of the oxides selected from a group that includes titanium oxide ($TiO_2$), tantalum pentoxide ($Ta_2O_5$), ferrous oxide ($Fe_2O_3$) and barium titanium oxide ($BaTiO_3$).

3. The method of claim 1, wherein the step of forming a mask layer includes depositing a photoresist material to form a photoresist layer or depositing a diffusion barrier material to form a diffusion barrier layer.

4. The method of claim 1, wherein the step of performing the hydrogen treatment includes using a hydrogen plasma treatment or a hot hydrogen treatment.

5. The method of claim 1, wherein the step of forming the first conductive layer includes depositing titanium or tungsten.

6. The method of claim 1, wherein the step of forming the first conductive layer includes depositing titanium nitride.

7. The method of claim 1, wherein the step of forming the first conductive layer further includes depositing titanium and then titanium nitride with the titanium layer sandwiched between the substrate and the titanium nitride layer.

8. The method of claim 1, wherein the step of forming the second conductive layer includes depositing tungsten.

9. The method of claim 1, wherein the side edges of the upper electrode of the capacitor align with the side edges of the lower electrode of the capacitor.

10. The method of claim 1, wherein the method further includes patterning the first conductive layer before the step of forming the refractory metal oxide layer.

11. The method of claim 1, wherein the method further includes patterning the refractory metal oxide layer before the step of performing hydrogen treatment.

12. The method of claim 1, wherein after the step of patterning the second conductive layer, the refractory metal oxide layer and the first conductive layer, the method further includes:

forming a second insulating layer above the second conductive layer;

forming a plurality of fourth openings in the second insulating layer to expose the upper electrode of each capacitor, forming a plurality of fifth openings in the second insulating layer to expose a portion of the second conductive layer that connects to at least one conductive region;

forming a third conductive layer over the fourth openings, the fifth openings and the second insulating layer; and patterning the third conductive layer to form a plurality of first conductive lines for supplying a reference voltage through the fourth opening to the upper electrode of each capacitor, and to form a plurality of second conductive lines each having a connection with at least one conductive region through the fifth opening.

13. The method of claim 12, wherein the reference voltage includes a voltage of ½ $V_{cc}$.

14. The method of claim 12, wherein the step of forming the third conductive layer includes depositing aluminum, copper or aluminum-copper alloy.

15. The method of claim 1, wherein the conductive region refers to the third or the fourth source/drain region of the logic FET, or the second gate electrode of the logic FET.

16. A method of manufacturing an embedded dynamic random access memory (DRAM), comprising:

providing a substrate that has a memory circuit region and a logic circuit region, wherein the memory circuit region has at least one transfer field effect transistor (transfer FET) with the transfer FET having a first and a second source/drain region and a first gate electrode, and the logic circuit region has at least one logic field effect transistor (logic FET) with the logic FET having a third and a fourth source/drain region and a second gate electrode;

forming a first insulating layer over the substrate;

patterning the first insulating layer to form a first and a second opening above the memory circuit region and a third opening above the logic circuit region, wherein the first and the second opening exposes the respective first and second source/drain regions of the transfer FET, and the third opening exposes at least one of the conductive regions in the logic circuit region;

forming a first conductive layer above the first insulating layer so that it covers the first, the second and the third openings without completely filling them;

forming a refractory metal oxide layer over the first conductive layer;

forming a mask layer above the refractory metal oxide layer, the mask layer at least covering the first opening and at least exposing the second opening and the third opening;

performing a hydrogen treatment so that the exposed refractory metal oxide layer is converted to an electrically conductive layer;

removing the mask layer;

forming a second conductive layer above the refractory metal oxide layer; and patterning the second conductive layer, the refractory metal oxide layer and the first conductive layer to form respectively an upper electrode, a dielectric layer and a lower electrode of a capacitor above the first opening, and forming a first and a second contact interconnect above the second and the third opening.

17. The method of claim 16, wherein the step of forming the refractory metal oxide layer includes depositing one of the oxides selected from a group that includes titanium oxide ($TiO_2$), tantalum pentoxide ($Ta_2O_5$), ferrous oxide ($Fe_2O_3$) and barium titanium oxide ($BaTiO_3$).

18. The method of claim 16, wherein the step of forming a mask layer includes depositing a photoresist material to form a photoresist layer or depositing a diffusion barrier material to form a diffusion barrier layer.

19. The method of claim 16, wherein the step of performing a hydrogen treatment includes using a hydrogen plasma treatment or a hot hydrogen treatment.

20. The method of claim 16, wherein the step of forming the first conductive layer includes depositing titanium or tungsten.

21. The method of claim 16, wherein the step of forming the first conductive layer includes depositing titanium nitride.

22. The method of claim 16, wherein the step of forming the first conductive layer further includes depositing titanium and then titanium nitride with the titanium layer sandwiched between the substrate and the titanium nitride layer.

23. The method of claim 16, wherein the step of forming the second conductive layer includes depositing tungsten.

24. The method of claim 16, wherein the side edges of the upper electrode of the capacitor align with the side edges of the lower electrode of the capacitor.

25. The method of claim 16, wherein the method further includes patterning the first conductive layer before the step of forming the refractory metal oxide layer.

26. The method of claim 16, wherein the method further includes patterning the refractory metal oxide layer before the step of performing the hydrogen treatment.

27. The method of claim 16, wherein after the step of patterning the second conductive layer, the refractory metal oxide layer and the first conductive layer, the method further includes:

forming a second insulating layer above the second conductive layer;

forming a fourth opening in the second insulating layer to expose the upper electrode of the capacitor, forming a fifth opening in the second insulating layer to expose a portion of the second conductive layer that connects to at least one conductive region;

forming a third conductive layer over the fourth opening, the fifth opening and the second insulating layer; and patterning the third conductive layer to form a first conductive line for supplying a reference voltage to the upper electrode of the capacitor through the fourth opening, and to form a second conductive line having connection with at least one conductive region through the fifth opening.

28. The method of claim 27, wherein the reference voltage includes a voltage of ½ $V_{cc}$.

29. The method of claim 27, wherein the step of forming the third conductive layer includes depositing aluminum, copper or aluminum-copper alloy.

30. The method of claim 16, wherein the conductive region refers to the third or the fourth source/drain region of the logic FET, or the second gate electrode of the logic FET.

* * * * *